(12) United States Patent
Torrisi et al.

(10) Patent No.: US 6,885,574 B2
(45) Date of Patent: Apr. 26, 2005

(54) LOW FATIGUE SENSING METHOD AND CIRCUIT FOR FERROELECTRIC NON-VOLATILE STORAGE UNITS

(75) Inventors: Salvatore Torrisi, Catania (IT); Giampiero Sberno, Catania (IT); Nicolas Demange, Cannizzaro (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 198 days.

(21) Appl. No.: 10/281,075

(22) Filed: Oct. 24, 2002

(65) Prior Publication Data

US 2003/0090926 A1 May 15, 2003

(30) Foreign Application Priority Data

Oct. 24, 2001 (EP) ............................................. 01830667

(51) Int. Cl.[7] .............................................. G11C 11/22
(52) U.S. Cl. ...................................... 365/145; 365/149
(58) Field of Search ............................. 365/145, 149, 365/228

(56) References Cited

U.S. PATENT DOCUMENTS

| 5,579,257 A | 11/1996 | Tai |
| 5,751,627 A | 5/1998 | Ooishi |
| 6,118,688 A | * 9/2000 | Hirano et al. ............... 365/145 |
| 2002/0008986 A1 | * 1/2002 | Tamura ...................... 365/145 |

FOREIGN PATENT DOCUMENTS

EP   01 83 0667   7/2002

* cited by examiner

*Primary Examiner*—Michael S. Lebentritt
*Assistant Examiner*—Toan Le
(74) *Attorney, Agent, or Firm*—Lisa K. Jorgenson; Bryan A. Santarelli; Graybeal Jackson Haley LLP

(57) ABSTRACT

A method of sensing a ferroelectric non-volatile information storage unit comprising two ferroelectric storage capacitors in mutually opposite polarization states, and a sensing circuit for actuating the method. The method comprises the steps of: making a voltage applied across the two storage capacitors substantially zero; starting from this condition, progressively increasing the voltage applied thereacross by supplying a prescribed current, until a first one of the two storage capacitors approaches a condition of polarization state reversal, thereby the voltage applied across said first storage capacitor starts to decrease with respect to the voltage applied across the second storage capacitor; and amplifying a voltage difference between the voltages applied across the two storage capacitors by making the voltage applied across the first storage capacitor substantially zero and the voltage applied across the second storage capacitor substantially equal to a non-zero voltage corresponding to a logic state opposite to a logic state corresponding to the zero voltage.

23 Claims, 3 Drawing Sheets

LOW FATIGUE SENSING METHOD AND CIRCUIT FOR FERROELECTRIC NON-VOLATILE STORAGE UNITS

PRIORITY CLAIM

The present application claims priority from European patent application no. 01830667.0, filed Oct. 24, 2001, presently pending.

TECHNICAL FIELD

The present invention concerns a method of sensing ferroelectric non-volatile storage units, and a sensing circuit implementing the method.

BACKGROUND

A ferroelectric non-volatile memory cell consists of a select, or access, transistor and a storage capacitor whose dielectric is made of a ferroelectric material film.

By applying an electric field of sufficient strength across the storage capacitor, the ferroelectric material is polarized in the direction of the electric field, and the acquired polarization is retained also after the electric field is removed. If an electric field of sufficient strength and direction opposite to the existing polarization is subsequently applied, the ferroelectric material becomes and remains polarized in such an opposite direction even after the electric field removal.

The effect of the polarization is a non-zero charge per unit storage capacitor area, which exists even when no voltage is applied across the capacitor and does not disappear in time. Information can thus be stored in the memory cell by associating the two opposite directions of polarization of the storage capacitor ferroelectric material with the two logic states "1" and "0".

Due to the similarity of the ferroelectric non-volatile memory cell with the dynamic RAM (DRAM) memory cell, the former is also referred to as ferroelectric RAM or FeRAM.

Two families of FeRAMs are known in the art, which differ from each other for the number of memory cells employed to store a single data bit.

FeRAMs of a first family use a single memory cell as a bit storage unit, and are for this reason also referred to as "1T1C" (one transistor, one capacitor). Thanks to the simplicity of the bit storage unit, this kind of approach is suitable for achieving very large memory sizes, of the order of megabits.

The process of reading a "1T1C" FeRAM cell involves a sharing of the charge of the memory cell storage capacitor with the parasitic capacitance of the respective bit line of the memory cell array. A voltage thus develops on the bit line that, through the respective select transistor, is electrically connected to the storage capacitor. The bit line voltage can take one of two different values, depending on the polarization of the storage capacitor. A sense amplifier, typically a comparator fed with the bit line voltage and with a reference voltage, discriminates between the two possible voltage values and provides the stored data bit by comparing the bit line voltage to the reference voltage.

A problem with the "1T1C" approach is the difficulties inherent in the generation of the reference voltage to be supplied to the sense amplifier. The reference voltage must be sufficiently accurate for discriminating between the two voltage values, which can develop on the bit line. In particular, the difficulties arise from the fact that the reference voltage must assure the possibility of discriminating between the two voltage values in any condition of temperature, supply voltage, process variations and storage capacitor degradation within the specified ratings. In order to comply with these requirements, complex circuitry must be provided for, which has a negative impact on the memory chip size. Another problem affecting the "1T1C" approach is that the read margin, i.e. the difference between the two possible voltage values that develop on the bit line, decreases as the bit line length increases, due to the increase in the bit line parasitic capacitance.

A second family of FeRAMs has bit storage units made up of two memory cells, and is for this reason referred to as "2T2C" (two transistors, two capacitors) or "fully differential". Considering a generic bit storage unit, the two storage capacitors are at any time polarized in mutually opposite directions (i.e., they store opposite logic states), except during the read and write operations. This allows having a reference quantity, which, during a read operation, can be used to discriminate between the two different logic states stored in the storage information unit.

This bit storage unit architecture does not suffer of the problems of the "1T1C" one, since no reference levels are needed for sensing the information stored in the bit storage unit. For this reason, this architecture is also referred to as "self-referenced".

A read cycle of a fully differential storage unit provides for initially bringing to a reference voltage (the ground voltage of the memory device) the two bit lines containing the accessed storage unit. Then, a same electric field is applied to the two storage capacitors of the information storage unit, by raising the capacitor plates not connected to the bit lines to a sufficiently high voltage (typically the supply voltage VDD of the memory device chip). Depending on their polarization state, one of the two capacitors is always subjected to a polarization state reversal or switching. The potential of the bit line coupled to the switching capacitor is higher compared to that of the bit line coupled to the non-switching capacitor.

The sensing circuit typically comprises two inverters connected in a latch configuration, with inputs connected to the two bit lines. The latch, when activated, amplifies the differential voltage of the two bit lines, raising the bit line coupled to the switching capacitor to the latch supply voltage (normally, the memory device supply voltage VDD) and grounding the other bit line.

After the latch has been activated and the bit lines have been brought one to the latch supply voltage, the other to the ground, the plates of the storage capacitors not connected to the bit lines are brought to the ground voltage, so as to restore the initial polarization state in the switching capacitor.

It can be appreciated that during a read operation one of the storage capacitors, namely the one which undergoes a polarization state switch when the electric field is applied thereto, goes through the entire hysteresis loop of the ferroelectric material. This increases the fatigue of the information storage unit, causing a relatively fast degradation thereof.

SUMMARY

In view of the state of the art described, an embodiment of the present invention provides a new sensing method, and a new sensing circuit actuating the method, for a ferroelectric non-volatile storage unit comprising two ferroelectric storage capacitors in mutually opposite polarization states, featuring a low fatigue of the storage units.

In brief, the method provides for initially making a voltage applied across the two storage capacitors substantially zero.

Then, starting from the condition of substantially zero voltage applied across the two storage capacitors, the voltage applied thereacross is progressively increased by supplying a prescribed current, until a first one of the two storage capacitors approaches a condition of polarization state reversal, thereby the voltage applied across the first storage capacitor starts to decrease with respect to the voltage applied across the second storage capacitor.

A voltage difference between the voltages applied across the two storage capacitors is then amplified, by making the voltage applied across the first storage capacitor substantially zero and the voltage applied across the second storage capacitor substantially equal to a non-zero voltage corresponding to a logic state opposite to a logic state that corresponds to the zero voltage.

A sensing circuit according to an embodiment of the invention comprises:

a pre-charge circuit activatable for pre-charging to a first voltage a first and a second circuit nodes each one connected to a first plate of a respective storage capacitor;

a plate line for selectively supplying to a second plate of the storage capacitors a plate line voltage equal to the first voltage or to a second voltage, and an amplifying circuit for amplifying a voltage difference between the first and second circuit nodes, bringing one among the first and second circuit nodes to the first voltage and the other circuit node to a third voltage, according to a polarization state of the storage capacitors.

A current supply is provided for supplying the first and second circuit nodes with a prescribed current, thereby charging the first and second circuit nodes.

The plate line supplies to the second plates of the storage capacitors the first voltage while the pre-charge circuit is activated and during the charging of the first and second circuit nodes, the plate line supplying to the second plates of the storage capacitors the second voltage only after the latch circuit has amplified the voltage difference between the first and second circuit nodes.

BRIEF DESCRIPTION OF THE DRAWINGS

Some of the features and advantages of the present invention will be made apparent by the following detailed description of two embodiments thereof, provided merely by way of non-limitative example, which will be made referring to the annexed drawings, wherein.

DETAILED DESCRIPTION

Figure 1:
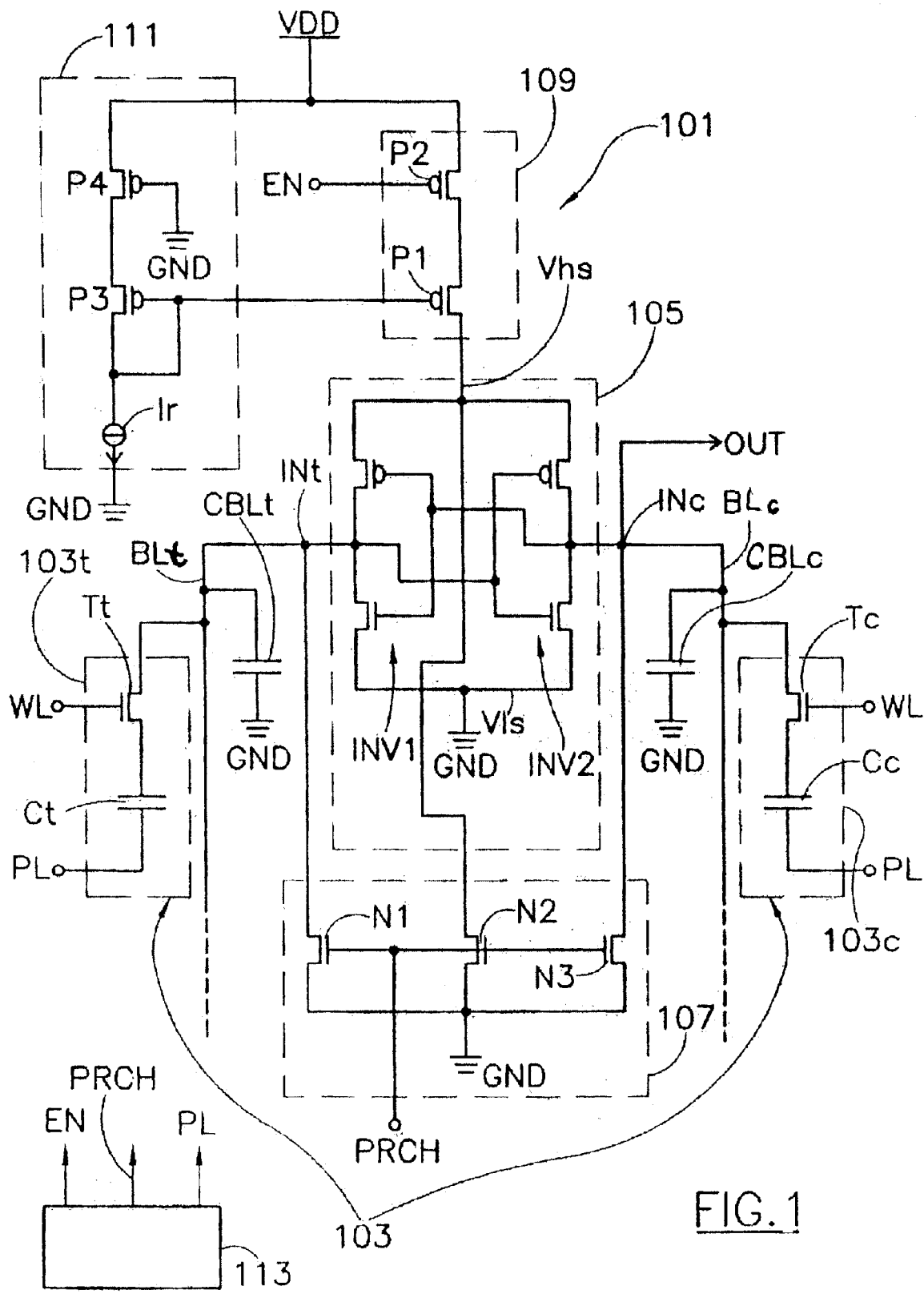
FIG. 1 is a circuit diagram of a sensing circuit according to a first embodiment of the present invention.

Referring to FIG. 1, a circuit diagram of a sensing circuit according to a first embodiment of the present invention is shown.

The sensing circuit, globally indicated by 101, includes several building blocks, namely a latch circuit 105, a pre-charge circuit 107, a current mirror circuit branch 109 and a reference current generator 111.

The sensing circuit 101 has two input lines INt, INc. The two input lines INt, INc are electrically connectable to a pair of bit lines BLt, BLc forming a column of an array of "2T2C" (fully differential) ferroelectric information storage units 103.

The specific pair of bit lines which is to be connected to the sensing circuit is from time to time determined by per-se conventional bit line selection circuits, not shown in the drawing, operating on the basis of an address signal supplied to the memory device.

Alternatively, the bit line selection circuits may not be provided, and a sensing circuit for each pair of bit lines BLt, BLc be instead provided for, with the input lines Int, Inc directly connected to the bit lines.

The information storage unit 103 is made up of two "1T1C" FeRAM memory cells, each one comprising a respective select transistor Tt, Tc in series with a storage capacitor Ct, Cc. In particular, the select transistor Tt, Tc is an N-channel MOSFET having a drain connected to the bit line BLt, BLc, a source connected to a first plate of the associated storage capacitor Ct, Cc and a gate connected to a word line WL of the array of information storage units. The storage capacitors Ct, Cc have their second plates connected to a common plate line PL.

The latch circuit 105 comprises two inverters, particularly of the CMOS type, INV1, INV2 connected to each other in latch configuration, with inputs connected to the sensing circuit input lines INc, INt, respectively, and outputs respectively connected to the sense amplifier input lines INt, INc. A low-side supply voltage line Vls of the two inverters INV1, INV2 is connected to a reference voltage line (the ground) GND of the memory device, while a high-side supply voltage line Vhs is connected to the current-mirror circuit branch 109.

The pre-charge circuit 107 comprises a first, a second and a third N-channel MOSFETs N1, N2, N3. The three MOSFETs have sources connected to the ground GND and gates connected to a pre-charge control signal PRCH. The first and third N-channel MOSFETs N1 and N3 have respective drains connected to the sensing circuit input lines INt and INc, respectively. The second N-channel MOSFET N2 has a drain connected to the node of the latch circuit 105 connected to the high-side supply voltage line Vhs.

The current mirror circuit branch 109 comprises a first and a second P-channel MOSFETs P1, P2 connected in series to each other. The first P-channel MOSFET P1 has a drain connected to the high-side supply voltage line Vhs of the latch circuit 105 and a source connected to the drain of the second P-channel MOSFET P2. This latter has a source connected to the voltage supply line VDD of the memory device, and the gate connected to a sensing enable control signal EN.

The reference current generator 111 comprises a third and a fourth P-channel MOSFETs P3, P4 connected in series to each other, and a current generator Ir in series to the third P-channel MOSFET P3. This latter P-channel MOSFET, which is diode-connected, has a source connected to a drain of the fourth P-channel MOSFET P4 and a gate connected to a gate of the first P-channel MOSFET P1 in the current mirror circuit branch 109. The fourth P-channel MOSFET P4 has a source connected to the supply voltage VDD and a gate connected to the ground GND.

The reference current generator 111 acts as a first current mirror circuit branch, mirroring the current of the current generator Ir into the current mirror circuit branch 109, which thus acts as a second current mirror circuit branch. The current mirroring elements are the first-and the third P-channel MOSFETs P1 and P3; the second P-channel MOSFET P2 allows to selectively enable/disable the current mirror circuit branch 109; the fourth P-channel MOSFET P4 is provided for symmetry.

It is to be observed that where several sensing circuits are to provided, for example for sensing in parallel a plurality of information storage units, the reference current generator 111 can be unique for all the sensing circuits, the gate of the third P-channel MOSFET P3 being in this case connected in parallel to the gates of the first P-channel MOSFETs P1 in all the current mirror circuit branches 109.

The output of the sensing circuit is one of the two input lines INc, INt, depending on the logic states assigned by convention to the different polarization states of the storage capacitors.

Also schematically shown in FIG. 1 in terms of a functional block is a sense timing controller 113, under the control of which the control signals PRCH and EN are generated and the plate line PL is driven.

Figures 2A, 2B:
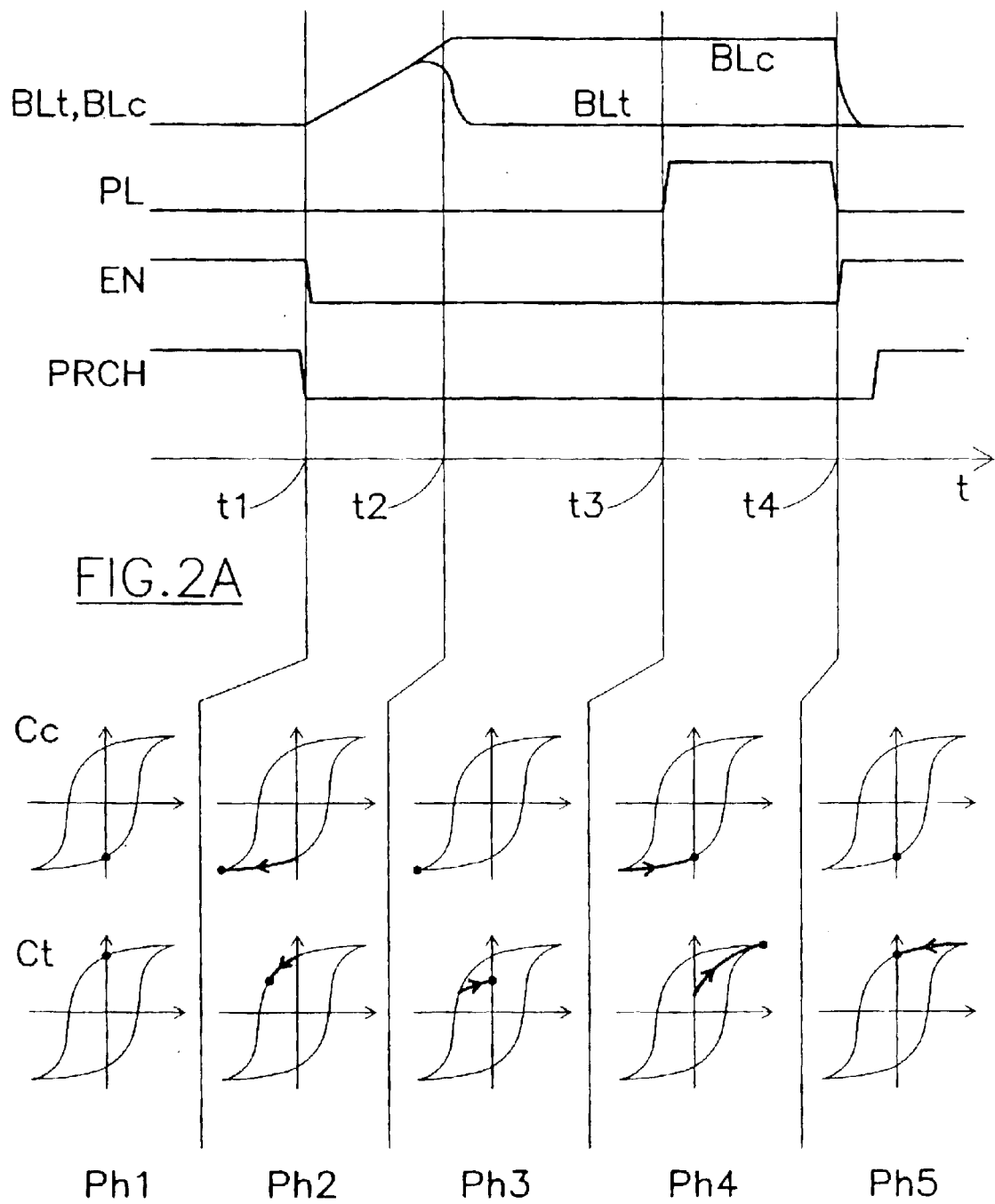
FIG. 2A is a time diagram showing the timing of the signals shown in FIG. 1 during a read operation of an information storage unit.
FIG. 2B shows the evolution, during a read operation, of the polarization states of the storage capacitors of FIG. 1 on the respective hysteresis loops, depicted as diagrams having in abscissa a voltage applied across the storage capacitors, and in ordinate the polarization thereof.

The operation of the sensing circuit will be now described in detail making reference to the timing diagram of a read operation shown in FIG. 2A.

A read operation is made up of a plurality of phases.

In a first phase (Ph1 in the drawing) of the read operation, after having selected the bit lines BLt, BLc by connecting them to the respective input lines INt, INc of the sensing circuit and having selected the word line WL by rising it to the supply voltage VDD, the pre-charge control signal PRCH is asserted (high logic level, corresponding to the supply voltage VDD). In this way, the first, second and third N-channel MOSFETs N1, N2, N3 are turned on, so as to bring the potential of the high-side supply voltage line Vhs and that of the bit lines BLt, BLc to the ground. A parasitic capacitance CBLt, CBLc associated with each bit line BLt, BLc is thus discharged. In this phase of the read operation, which can be referred to as "pre-charge to ground" phase, the plate line PL is kept to ground and the sensing circuit is deactivated by keeping the high-side supply voltage line Vhs to ground. Also, the current mirror branch circuit 109 is kept deactivated, since the enable signal EN is de-asserted (high logic level).

In the following phase (Ph2 in the drawing), starting at time instant t1, the pre-charge control signal PRCH is de-asserted, so that the pre-charge circuit 107 is turned off. The latch circuit 101 is instead enabled by asserting the enable signal EN. By asserting the enable signal EN, the current mirror branch circuit 109 is activated. The current flowing through the current mirror branch circuit 109 is proportional to the current flowing through the third P-channel MOSFET P3 of the reference current generator, i.e. proportional to the current generated by the current generator Ir. The proportionality factor depends on the current mirroring ratio, which is on the ratio of the aspect ratios of the first and third P-channel MOSFETs P1, P3.

Since the bit lines have been previously (in phase Ph1) pre-charged to the ground, the pull-up transistors of the two inverters INV1, INV2 of the latch circuit 105 are turned on, and supply (each approximately a half of) the constant current flowing through the current mirror branch circuit 109 to the respective bit lines BLt, BLc.

In this way, the parasitic capacitance CBLt, CBLc of the two bit lines BLt, BLc is charged up by a constant current, approximately equal to a half of the current flowing through the current mirror branch circuit 109. As shown in FIG. 2A, the evolution in time of the potential of each bit line BLt, BLc depends on the polarization state of the associated storage capacitor Ct, Cc, i.e. on the information stored in the information storage unit 103.

Assuming by way of example only that the memory cell 103t stores a logic state such that the respective storage capacitor Ct is subject to a polarization state switch, the potential of the bit line BLt increases linearly until the bit line potential (coincident with the voltage across the storage capacitor Ct) approaches the coercive voltage Vc of the ferroelectric material (the voltage at which the polarization state of the storage capacitor Ct begins to switch). A fraction of the charge of the bit line capacitance CBLt starts to be subtracted therefrom, so that the potential of the bit line BLt decreases. At the same time, the potential of the other bit line BLc, connected to the memory cell 103c whose storage capacitor Cc is not subject to a switch of polarization state, follows a linear evolution.

The third phase (Ph3 in the drawing) of the read operation begins at time instant t2: when the difference between the potential of the bit line BLt and that of the bit line BLc exceeds a prescribed value (dependent on the threshold voltage of the pull-down transistors of the two inverters INV1, INV2), the latch circuit 105 is automatically turned on. This causes the bit line potential difference to be amplified: the potential of the bit line BLt is brought to the ground, while that of the bit line BLc is raised to the high-side supply voltage Vhs. This latter voltage is approximately equal to the supply voltage VDD.

Then, in the fourth phase (Ph4) of the read operation, beginning at time instant t3, the initial polarization state is restored in the memory cell, which, in the previous phase, has switched. The plate line PL potential is raised to the voltage of the supply voltage line VDD. In this way, the voltage across the storage capacitor Ct is made equal to the supply voltage VDD.

In the final phase (Ph5) of the read operation, beginning at time instant t4, the plate line PL potential is brought back to the ground, and the enable control signal EN is de-asserted. The pre-charge control signal PRCH is asserted again, so that the bit line parasitic capacitances CBLt, CBLc are discharged to ground.

Figure 3:
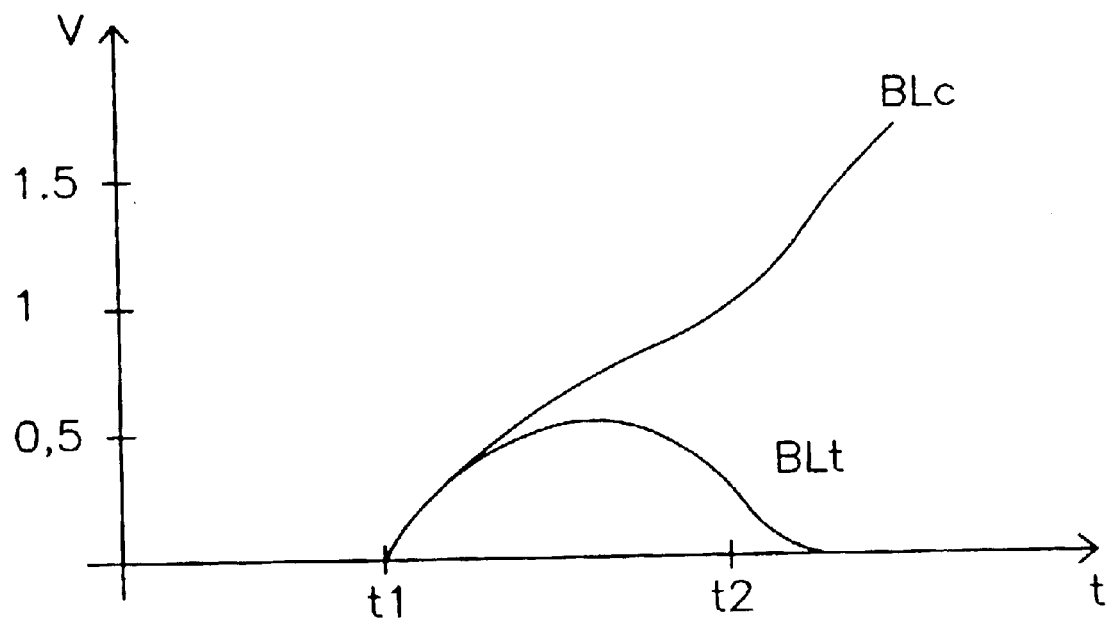
FIG. 3 shows the evolution in time of the bit line voltages of FIG. 1, resulting from a circuit simulation.

It can be appreciated that the voltage across the storage capacitor Ct which undergoes a polarization state switch is rather low, and equal to the difference between the bit line BLt potential and the plate line PL potential (this latter being equal to the ground). FIG. 3 shows the evolution of the potentials of the bit line BLt, BLc during the read operation, particularly the second phase Ph2, resulting from circuit simulations carried out by the Applicant in the following conditions:

supply voltage (VDD): 2.6 V;
reference current (Ir): 10 $\mu$A;
bit line parasitic capacitances (CBLt, CBLc): 350 fF;
storage capacitor area: 1.35 $\mu m^2$;
ferroelectric coercive voltage (Vc): 0.6 V.

With the above conditions, the voltage across the storage capacitor Ct undergoing a polarization state switch is approximately equal to 0.6 V. This value is to be compared to the typical voltage value which is applied across the switching capacitor in the conventional sensing circuit, equal to the supply voltage VDD.

As a consequence, according to the present invention the storage capacitor Ct undergoes only a partial polarization state switch, instead of a full switch from one stable polarization state to the opposite one. This is evidenced in the hysteresis diagrams reported in FIG. 2B, showing the movement of the polarization state of the capacitors Cc (in the upper line) and Ct (in the lower line) on the respective hysteresis loop during the various phases of the read operation. In this diagrams, the abscissa represents the voltage applied across the storage capacitors Cc and Ct, namely the difference between the bit line voltage and the plate line voltage, and the ordinate represents the polarization of the storage capacitors; the current polarization state of the storage capacitors is represented by a dot. It is possible to see that the read operation causes only a small displacement on the hysteresis loop of the polarization state of the storage capacitor Ct. On the contrary, according to the prior art the capacitor Ct would go through the complete hysteresis loop.

Thanks to this, the fatigue to which the switching storage capacitor Ct is subject is significantly reduced. Also the restore phase takes advantage of the partial polarization state switch, since only the small polarization lost during the second phase of the read operation is to be restored.

Another advantageous consequence is the reduction of the current consumption due to the switching of the storage capacitor Ct.

Still another advantage is that it is not necessary to provide a voltage booster for boosting the supply voltage VDD in order to supply the selected word line WL with a voltage higher than the voltage supply VDD. In fact, contrary to the known sensing circuits, the select transistors Tt, Tc need not transfer the full supply voltage VDD to the storage capacitors Ct, Ct.

Figure 4:
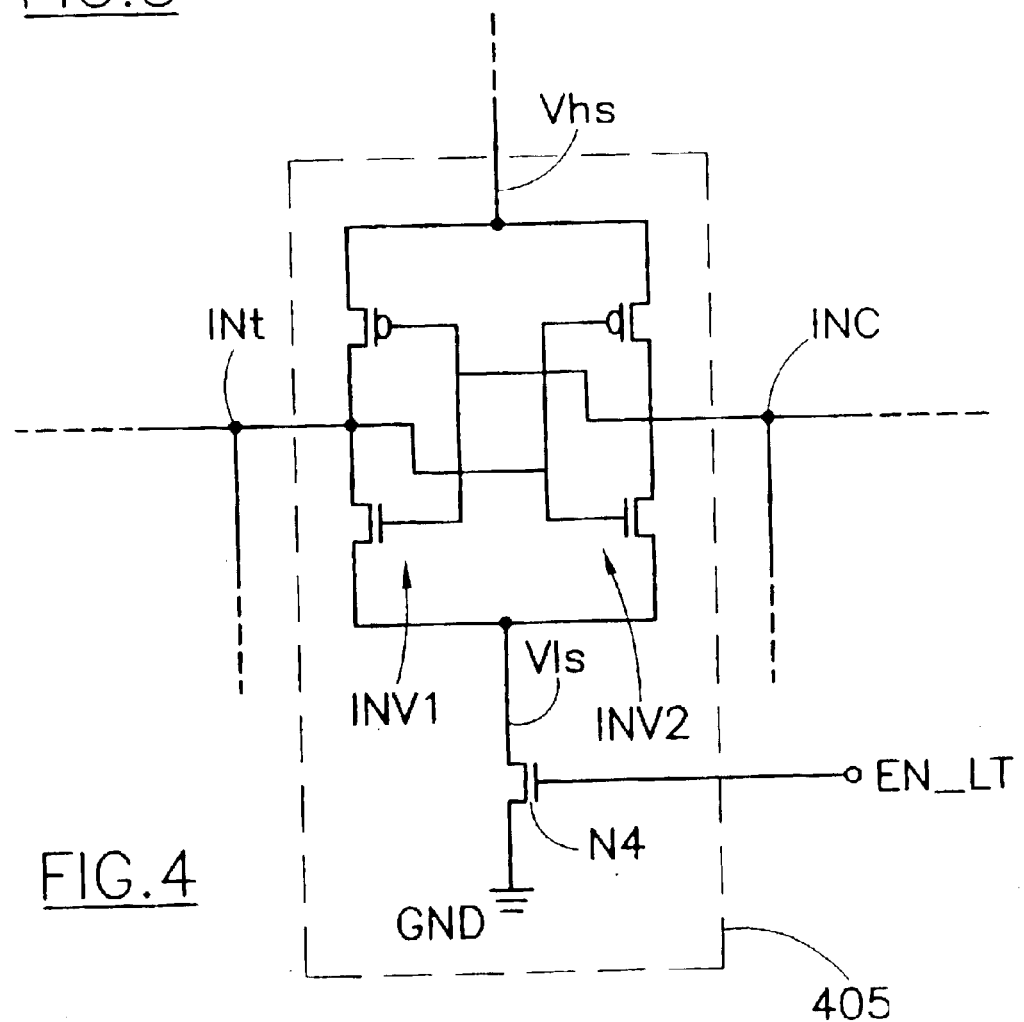
FIG. 4 is a circuit diagram of a part of a sensing circuit according to a second embodiment of the present invention.

FIG. 4 shows a portion, namely a latch circuit 405, of a sensing circuit according to a second embodiment of the present invention. Differently from the previous embodiment, the two inverters INV1, INV2 are not connected directly to the ground GND: an additional switch, e.g. an N-channel MOSFET N4, is provided between the low side supply voltage line Vls of the latch circuit, i.e. the sources of the pull-down transistors of the inverters INV1, INV2, and the ground. The switch N4 has a gate connected to an enable latch control signal EN_LT which is asserted to turn the MOSFET N4 on only starting from a prescribed time instant during a read operation, when the potential of the bit line BLt, associated with the switching capacitor Ct, has reasonably reached the coercive voltage Vc of the ferroelectric material. In this way, it is avoided that the two pull-down transistors of the inverters INV1, INV2 turn on prematurely. This makes the sensing circuit less sensitive to the threshold voltage of the pull-down transistors of the inverters INV1, INV2 and to the coercive voltage Vc of the ferroelectric material.

Albeit the invention has been here described in terms of two embodiments thereof, it is clear that those skilled in the art will be able to devise several modifications to the described embodiments, as well as other embodiments, without for this reason departing from the spirit and scope of the invention.

For example, instead of having only one current mirror branch circuit 109 for the pair of bit lines BLt, BLc, two current mirror branch circuits may be provided, each one associated with a respective bit line of the pair.

As another example, the current mirror structure formed by the reference current generator 111 and the current mirror branch circuit 109 might be replaced by a simple resistive load element, such as a resistive P-channel MOSFET.

What is claimed is:

1. A method of sensing a ferroelectric non-volatile information storage unit comprising two ferroelectric storage capacitors in mutually opposite polarization states, the method comprising the steps of:

making a voltage applied across the two storage capacitors substantially zero;

starting from the condition of substantially zero voltage applied across the two storage capacitors, progressively increasing the voltage applied thereacross by supplying a prescribed current, until a first one of the two storage capacitors approaches a condition of polarization state reversal, thereby the voltage applied across said first storage capacitor starts to decrease with respect to the voltage applied across the second storage capacitor; and amplifying a voltage difference between the voltages applied across the two storage capacitors by making the voltage applied across the first storage capacitor substantially zero and the voltage applied across the second storage capacitor substantially equal to a non-zero voltage corresponding to a logic state opposite to a logic state corresponding to the zero voltage.

2. The method according to claim 1, comprising the steps of:

pre-charging to a first voltage a first and a second circuit nodes, each of which connected to a first plate of a respective storage capacitor, keeping second plates of the two storage capacitors to the first voltage;

while keeping the second plates of the two storage capacitors to the first voltage, charging the first and second circuit nodes by supplying the prescribed current, thereby applying to the two storage capacitors an electric field, whereby the first circuit node, connected to the first plate of the storage capacitor polarized as the applied electric field, moves towards a second voltage while the second circuit node, connected to the first plate of the storage capacitor having opposite polarization with respect to the applied electric field, starts to move back towards the first voltage when the voltage of the second circuit node reaches a prescribed value characteristic of the ferroelectric material;

amplifying a voltage difference between the first and second circuit nodes by bringing the circuit node associated with storage capacitor polarized as the applied electric field to the second voltage and the other circuit node to the first voltage.

3. The method according to claim 2, comprising, after the step of amplifying the voltage difference between the first and second circuit nodes, a step of applying a third voltage to the second plates of the storage capacitors for restoring an initial polarization state in the two storage capacitors.

4. A circuit for sensing a ferroelectric non-volatile information storage unit comprising two storage capacitors in mutually opposite polarization states, the circuit comprising:

a pre-charge circuit activatable for pre-charging to a first voltage a first and a second circuit nodes each one connected to a first plate of a respective storage capacitor;

a plate line for selectively supplying to a second plate of the storage capacitors a plate line voltage equal to the first voltage or to a second voltage, and an amplifying circuit for amplifying a voltage difference between the first and second circuit nodes, bringing one of the first and second circuit nodes to the first voltage and the other circuit node to a third voltage, according to a polarization state of the storage capacitors, characterized in that a current supply is provided for supplying the first and second circuit nodes with a prescribed current, thereby charging the first and second circuit nodes, and in that the plate line supplies to the second plates of the storage capacitors the first voltage while the pre-charge circuit is activated and during the charging of the first and second circuit nodes, the plate line supplying to the second plates of the storage capacitors the second voltage only after the amplifying circuit has amplified the voltage difference between the first and second circuit nodes.

5. The circuit according to claim 4, in which the current supply supplies the prescribed current to the first and second circuit nodes through the amplifying circuit.

6. The circuit according to claim 5, in which the current supply comprises a current mirror with a first branch run through by a reference current and at least one second branch run through by a mirrored current, the at least one second branch supplying the mirrored current to the amplifying circuit.

7. The circuit according to claim 6, in which the amplifying is a circuit comprising a pair of latch-connected inverters having a low-side supply node and a high-side supply node, the high-side supply node being connected to the second branch of the current mirror for receiving the mirrored current.

8. The circuit according to claim 7, in which the low-side supply node is connected to the first voltage through a switch selectively activatable for supplying to the low-side supply node to the first voltage.

9. A read circuit for reading data from a storage unit that includes two ferroelectric cells each having a respective polarization, the read circuit comprising:

an amplifier operable to increase a respective voltage across each of the cells until the polarization of one of the cells partially reverses, and to amplify a difference between the respective voltages caused by the partial reversal.

10. The read circuit of claim 9 wherein the amplifier comprises a sense amplifier.

11. The read circuit of claim 9, further comprising:

a current circuit operable to provide a current to the amplifier; and wherein the amplifier is operable to increase the respective voltage across each of the cells by charging the cells with first and second portions of the current, respectively.

12. The read circuit of claim 9, further comprising an enable circuit operable to enable the amplifier to amplify the difference between the respective voltages after the polarization of the one cell partially reverses.

13. The read circuit of claim 9, further comprising a precharge circuit operable to initialize the respective voltages across the cells to a predetermined voltage level before the amplifier begins to increase the respective voltages.

14. The read circuit of claim 9, further comprising a restore circuit operable to restore the one of the cells to an initial polarization.

15. The read circuit of claim 9 wherein the value of the data corresponds to the polarity of the difference between the voltages across the cells.

16. A memory, comprising:

first and second bit lines;

a storage unit operable to store data and including first and second ferroelectric storage cells respectively coupled to the first and second bit lines; and a read circuit coupled to the bit lines, operable to increase a respective voltage on each of the first and second bit lines until the respective voltages diverge, and operable to amplify the difference between the divergent voltages.

17. The memory of claim 16 wherein the read circuit comprises a sense amplifier that is operable to amplifier the difference between the divergent voltages.

18. The memory of claim 16 wherein the read circuit comprises a charger that is operable to increase the respective voltage on each of the first and second bit lines by charging the first and second cells with respective first and second currents.

19. The memory of claim 16 wherein the read circuit comprises a charger that is operable to increase the respective voltage on each of the first and second bit lines by charging the first and second cells with respective first and second currents, the first current being substantially equal to the second current.

20. The memory of claim 16 wherein:

the first and second bit lines have first and second parasitic capacitances associated therewith; and the read circuit comprises a charger that is operable to increase the respective voltage on each of the first and second bit lines by charging the first and second cells and the first and second parasitic capacitances with respective first and second currents.

21. The memory of claim 16 wherein the read circuit is operable to amplify the difference between the respective voltages a predetermined time after beginning to increase the respective voltages on the first and second bit lines.

22. The memory of claim 16 wherein the read circuit is operable to amplify the difference between the respective voltages after the voltages diverge.

23. The memory of claim 16 wherein the read circuit comprises a precharger that is operable to initialize the first and second bit lines to a predetermined voltage level before the respective voltages on the bit lines begin to increase.

* * * * *